(12) United States Patent
Che et al.

(10) Patent No.: US 9,093,654 B2
(45) Date of Patent: Jul. 28, 2015

(54) BIS-(8-QUINOLINATO-N,O)PLATINUM(II) BASED ORGANIC PHOTOVOLTAIC CELL

(75) Inventors: Chi Ming Che, Hong Kong (CN); Hai Feng Xiang, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 691 days.

(21) Appl. No.: 13/022,242

(22) Filed: Feb. 7, 2011

(65) Prior Publication Data

US 2011/0192455 A1  Aug. 11, 2011

Related U.S. Application Data

(60) Provisional application No. 61/302,794, filed on Feb. 9, 2010.

(51) Int. Cl.
H01L 51/46 (2006.01)
H01L 31/0224 (2006.01)
H01L 51/30 (2006.01)
H01L 51/00 (2006.01)
B82Y 10/00 (2011.01)
H01L 51/42 (2006.01)

(52) U.S. Cl.
CPC .............. H01L 51/0087 (2013.01); B82Y 10/00 (2013.01); *H01L 51/001* (2013.01); *H01L 51/0046* (2013.01); *H01L 51/424* (2013.01); *H01L 51/4246* (2013.01); *H01L 51/4253* (2013.01); *H01L 2251/308* (2013.01); *Y02E 10/549* (2013.01)

(58) Field of Classification Search
None
See application file for complete search history.

(56) References Cited

U.S. PATENT DOCUMENTS

2009/0267060 A1* 10/2009 Forrest et al. ................... 257/40

OTHER PUBLICATIONS

Masalovich et al., "Thin-Film Conducting Polymers Based on Ni(II), Pd(II), and Pt(II) Complex with 8-Quinolinol," Russ. J. Appl. Chem., 2007, vol. 80, No. 8, pp. 1429-1431.*
Xiang et al., "Deep-red to near-infrared electrophosphorescence based on bis(8-hydroxyquinolato) platinum (II) complexes," App. Phys. Lett. 92, 163305 (2008).*
Indelli et al., "Redox properties of electronically excited bis(8-quinolinolato)platinum(II)," Congr. Naz. Chim. Inorg., [Atti], 12th (1979), 394-8 Publisher: Coop. Libr. Univ. Editrice Tergeste, Trieste, Italy. CODEN: 45MIA3; English. (Abstract).*
Ballardini et al.,"Bis(8-quinolinolato)platinum(II): a Novel Complex Exhibiting Efficient, Long-Lived Luminescence in Fluid Solution," Inorganica Chimica Acta, 31 (1978) L423-L424.*

* cited by examiner

*Primary Examiner* — Ling Choi
*Assistant Examiner* — Catherine S Branch
(74) *Attorney, Agent, or Firm* — Saliwanchik, Lloyd & Eisenschenk (57) ABSTRACT

Organic photovoltaic (OPV) cells and methods of forming the same are provided. An OPV cell can include an organic photoactive layer comprising bis-(8-quinolinolato-N,O)platinum (II) (PtQ$_2$) having a general structure disclosed herein as Structure I. A method of forming an OPV cell can include forming an organic photoactive layer on a substrate, which can include a transparent electrode. The organic photoactive layer can comprises PtQ$_2$ having the general structure of Structure I.

20 Claims, 4 Drawing Sheets

BIS-(8-QUINOLINOLATO-N,O)PLATINUM(II) BASED ORGANIC PHOTOVOLTAIC CELL

CROSS-REFERENCE TO RELATED APPLICATION

This application claims the benefit of U.S. provisional application Ser. No. 61/302,794, filed Feb. 9, 2010, which is incorporated herein by reference in its entirety.

FIELD OF THE INVENTION

This invention relates to organic photovoltaic (OPV) cells using bis-(8-quinolinolato-N,O)platinum (II) ($PtQ_2$) as an active material.

BACKGROUND OF THE INVENTION

It is widely recognized that fossil fuels, such as petroleum and charcoal, will be consumed soon. In addition, the by-products generated from fossil fuels can contribute to global warming problems due to greenhouse gases such as carbon dioxide. The planet capability of natural purification has been decreased, and that is detrimental to the survival of humans. Thus, there are world-wide efforts to develop environmentally friendly energy resources and devices with low energy consumption and/or driven by renewable energy such as solar energy. Solar cells or photovoltaic (PV) cells are a type of optoelectronic device which generate electricity through the absorption of electromagnetic radiation (UV, visible, and IR radiation). To date, photovoltaic cells made from inorganic semiconductors, such as Si, CdTe, and $CuIn_xGa_{1-x}Se$, have dominated the solar cell industry. Particularly, poly-silicon (poly-Si) and single crystal silicon (SC-Si) together contributed to nearly 90% of the market share. However, the shortage of Si materials, and the high processing cost of inorganic semiconductors have posted a drawback in the development of the solar cell industry.

In contrast, the potential low cost, ease of process in large scale production, and compatibility on flexible substrates of organic semiconductors are appealing for photovoltaic applications. Organic photovoltaic (OPV) cells comprise at least one component that utilize organic or organometallic small molecules or polymeric materials for light absorption and charge processes. Harnessing the power of chemical synthesis, a large variety of organic molecules or polymers with different band gaps and absorption coefficients can be synthesized to maximize the light absorption and power generated from the photovoltaic cells. Thus, the organic photovoltaic cell has emerged as a new class of solar cell technologies. (*Prog. Photovolt: Res. Appl.* 2007; 15, 659).

Within the area of organic photovoltaic cells, various device architectures have been explored including the dye-sensitized solar cell (DSSC), organic/inorganic hybrid organic cells, and organic photovoltaic cells with heterojunctions. In 1986, C. W. Tang found that a bilayer heterojunction structure fabricated from copper phthalocyanine (CuPc) and perylene tetracarboxylic derivative gives a power conversion efficiency (PCE) of 0.95% at Eastman Kodak. Other small molecules such as pentacene, tetracene, and metal phthalocyanines (PCs) are among the most studied donor materials. (*Appl. Phys. Lett.*, 2004, 85, 5427; *Appl. Phys. Lett.*, 2004, 85, 6272; *Appl., Phys. Lett.*, 2005, 86, 243506) Notably, a combination of fullerene ($C_{60}$) or perylene and organic semiconductor, which has been under development for electronic materials applications since the 1990's, is the most popular structure of organic solar cells. Starting from the 2000's, a PCE of more than 6% has been achieved (*Principles of Solar Cells*, Hongreung Publication).

Recently, tremendous progress has been made in the development of OPV cells based on π-conjugated semiconductors as electron donor (p-type) materials, such as regio-regular poly(3-alkylthiophene)s (P3HTs), (*Adv. Mater.* 2006, 18, 572; *Appl. Phys. Lett.* 2005, 87, 083506; *Nat. Mater.* 2006, 5, 197) platinum(II) polyyne polymer, (*Nature Mater.* 2007, 6, 521), and oligothiophenes (*Adv. Mater.* 2006, 18, 2872). Devices with greater than 5% PCE have been achieved from nanostructures of an interpenetrating donor/acceptor polymer network, which is prepared by limiting the solvent evaporation rate or post-fabrication thermal annealing. (*Adv. Funct. Mater.* 2003, 13, 85; *Appl. Phys. Lett.* 2005, 86, 063502; *Adv. Funct. Mater.* 2005, 15, 1617; *Nat. Mater.* 2005, 4, 864)

Bis-(8-quinolinolato-N,O)platinum (II) ($PtQ_2$) complexes were first prepared by R. Ballardini et. al. in 1978 (*Inorganica Chimica Acta* 1978, 31, 1, L423-L424), which show orange to red emissions in dilute solutions. However, no practical application for $PtQ_2$ complexes was found until 2008. In 2008, Che fabricated deep red to near infrared organic light-emitting diodes (OLEDs) from $PtQ_2$ complexes (*Applied Physics Letter* 2008, 92, 16, 163305). As the device efficiency is low (up to 0.32 cd/A), no further development in OLED application has been made.

The references cited in this application are incorporated herein by reference.

BRIEF SUMMARY OF THE INVENTION

The present invention relates to an organic photovoltaic cell which contains at least one bis-(8-quinolinolato-N,O) platinum (II) ($PtQ_2$) complex and corresponding derivatives as a light absorption and charge-transporting material in an organic photoactive layer. The disclosed bis-(8-quinolinolato-N,O)platinum (II) ($PtQ_2$) complexes and their derivatives have photocurrent/power generation properties. This invention relates the organometallic quinacridone bis-(8-quinolinolato-N,O)platinum (II) ($PtQ_2$) complex derivative-based photovoltaic cells for potential applications in batteries, energy storage, and powering up electronics.

This invention relates organic photovoltaic (OPV) cells using bis-(8-quinolinolato-N,O)platinum (II) ($PtQ_2$) with structure I as an active material:

Structure I wherein $R_1$-$R_6$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

The OPV cell can be single layer, multi-layer, tandem structured, and/or a dispersed heterojunction OPV cell.

In an embodiment, an organic photovoltaic (OPV) cell can include an organic photoactive layer comprising bis-(8-quinolinolato-N,O)platinum (II) (PtQ$_2$) having structure I, wherein R$_1$-R$_6$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

In another embodiment, an OPV cell can include one of Complexes 1-5 as the active layer therein.

In another embodiment, a method of forming an organic photovoltaic (OPV) cell can include the step of forming an organic photoactive layer on a substrate (which can include a transparent electrode), wherein the organic photoactive layer comprises bis-(8-quinolinolato-N,O)platinum (II) (PtQ$_2$) having structure I, wherein R$_1$-R$_6$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

DETAILED DISCLOSURE OF THE INVENTION

The preferred embodiments of the present invention will now be described with reference to the accompanying drawings. These embodiments will be presented only by way of example for implementing the invention and not by way of limitation.

When the terms "on" or "over" or "above" are used herein, when referring to layers, regions, patterns, or structures, it is understood that the layer, region, pattern, or structure can be directly on (and in contact with) another layer or structure, or intervening layers, regions, patterns, or structures may also be present. When the terms "under" or "below" are used herein, when referring to layers, regions, patterns, or structures, it is understood that the layer, region, pattern, or structure can be directly under (and in contact with) the other layer or structure, or intervening layers, regions, patterns, or structures may also be present.

Figure 1:
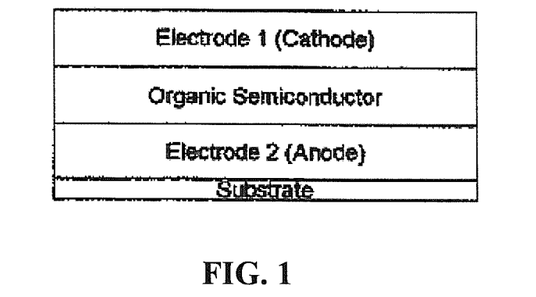
FIG. 1 is a schematic diagram of an organic photovoltaic cell incorporating the present invention.
Figure 2:
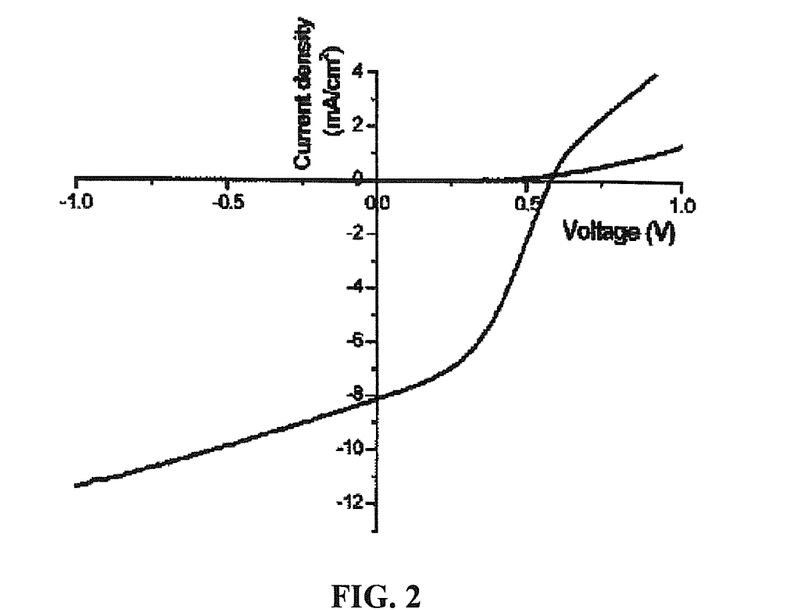
FIG. 2 shows current-density vs. voltage (J-V) curves of an organic photovoltaic cell fabricated with complex 5 in the dark and under illumination.

FIG. 1 shows a cross section through a photovoltaic cell incorporating an organic photoactive layer according to an embodiment of the present invention. The organic photoactive layer can be on a transparent electrode or carrier material on a substrate. The substrate is not specifically limited as long as it is transparent, and it can be made of for example, glass, plastic, polymer foils, crystal, or similar materials. The electrode 2 of the present invention may be made from any transparent conducting materials. Electrode 2 (anode) may include, for example, indium-tin-oxide (ITO), other transparent metal oxides, carbon nanotubes, conducting polymers such as polyethylenedioxythiophene, poly(3,4-ethylenedioxythiophene)poly(styrene-sulfonate) (PEDOT:PSS), polyacetylene, polypyrrole, polythiophene, polyaniline, and composite polymers with carbon nanotubes, among other examples. After the organic photoactive layer is deposited, electrode 1 is then deposited. Electrode 1 is not specifically limited and examples may include Al, Ag, Mg, Cu, Au, In, Zn, an alkali metal (group 1 metal), an alkali earth metal (group 2 metal), a transition metal, rare earth metal, or alloys. In an embodiment, the thickness of electrode 1 (cathode) can be from 20 nm to 1000 nm.

The organic photoactive layer can include at least an organometallic PtQ$_2$ semiconductor having the chemical structure of structure I; or an organic semiconductor having chemical structure of structure I that acts as an electron donor and electron acceptor layer (donor-acceptor heterojunction). The donor-acceptor heterojunction in an embodiment of the present invention could be bulk heterojunction, blended heterojunction, or connected in series as stacked or tandem cell. In an embodiment, the thickness of the PtQ$_2$ layer can be from 20 nm to 40 nm.

The electron acceptor layer in the organic photoactive layer of the present invention can be any organic semiconductor which exhibits electron accepting properties or electron transport properties. Examples of electron acceptor layer may include, but not limited to, perylene derivatives, 3,4,9,10-perylenetetracarboxylic bis-benzimidazole (PTCBI), quinoxaline derivatives, poly(phenylquinoxaline) (PPQ), C$_{60}$, and composite polymers containing C$_{60}$. In an embodiment, the thickness of the electron accepting layer can be from 20 nm to 80 nm.

The PtQ$_2$ complexes with chemical structure of Structure I can be referred to as cyclometallated complexes. The platinum center in Structure I is in a +2 oxidation state and has a square planar geometry. The coordination sites of the platinum center are occupied by two deprotonated 8-hydroxyquinoline units through one nitrogen atom and one oxygen atom. Representative examples of PtQ$_2$ complexes (Complexes 1-5) based on Structure I are shown below:

Complex 1

Complex 2

-continued

Complex 3

Complex 4

Complex 5

In preferred embodiments, there is a general method for preparing PtQ$_2$ complexes with the corresponding 8-hydroxyquinoline in the representative examples. To prepare these PtQ$_2$ complexes, a mixture of potassium tetrachloroplatinate (K$_2$PtCl$_4$) and 8-hydroxyquinoline in glacial acetic acid was refluxed for 24 hours, and gave a red suspension. The red solid was washed with water and acetone, and recrystallized in CH$_2$Cl$_2$ or DMF. Reaction I below illustrates the preferred use of acetic acid as a solvent in forming neutral platinum complexes.

Reaction I

In an embodiment, an exciton blocking layer can be introduced between the organic photoactive layer and electrode 1 (cathode) as a double heterostructure. Examples of the exciton blocking layer may include, but are not limited to, bathocuproine derivatives, bathophenanthroline derivatives, tris-8-hydroxy-quinolinato aluminum derivatives, and 2,9-Bis (naphthalen-2-yl)-4,7-diphenyl-1,10-phenanthroline derivatives. In an embodiment, the thickness of the photoactive layer can be from 20 nm to 120 nm. In an embodiment, the thickness of the exciton blocking layer can be from 7.5 nm to 10 nm.

In one embodiment, the organic photoactive layer, including the PtQ$_2$ complex and electron acceptor layer, can be fabricated by vacuum deposition, electron beam deposition, sputtering, spray coating, spin coating, drop casting, and dip coating. The exciton blocking layer and electrode(s) can be fabricated by vacuum deposition, electron beam deposition, and sputtering.

In another preferred embodiment, the organic photoactive layer, exciton blocking layer, and electrode(s) can be deposited onto the transparent electrode substrate sequentially by vacuum deposition without breaking the vacuum during the fabrication process.

More preferably, the PtQ$_2$ complexes used in the organic photovoltaic cell should form a crystalline or polycrystalline thin film on the substrate.

The PtQ$_2$ complexes used in the organic photovoltaic cell should have high absorption coefficients of, for example, $\alpha > 10^5$ cm$^{-1}$, and large spectral coverage within the solar spectrum.

In one embodiment, the electrode 2 (anode) is transparent and is directly on and in contact with the substrate. The organic photoactive layer is directly on and in contact with the electrode 2, and the electrode 1 (cathode) is metal and is directly on and in contact with the organic photoactive layer. In an alternative embodiment, an exciton blocking layer can be present between the organic photoactive layer and electrode 1, such that the exciton blocking layer is in contact with both the organic photoactive layer and electrode 1.

The following examples are illustrative of the practice of the present invention, but should not be considered in any way as limiting the scope thereof.

Materials and Methods

All patents, patent applications, provisional applications, and publications referred to or cited herein are incorporated by reference in their entirety, including all figures and tables, to the extent they are not inconsistent with the explicit teachings of this specification.

Following are examples that illustrate procedures for practicing the invention. These examples should not be construed as limiting. All percentages are by weight and all solvent mixture proportions are by volume unless otherwise noted.

Example 1

The configuration of bis-(8-quinolinolato-N,O)platinum (II) (PtQ$_2$) based organic photovoltaic cell in the present invention is schematically shown in FIG. 1. The organic photovoltaic cell has multiple layers as shown. The transparent electrode substrate is preferably indium-tin oxide on glass (ITO-glass substrate). An organic photoactive layer containing at least one PtQ$_2$ complex is deposited onto the ITO glass by vacuum deposition. An electron donor layer, preferably comprising C$_{60}$ can be deposited onto the PtQ$_2$ complex(es) or co-deposited with the PtQ$_2$ complex(es). An exciton blocking layer preferably comprising bathocuproine (BCP) is then deposited onto the organic photoactive layer without breaking the vacuum. The metal electrode, preferably comprising Al, is then placed on top of the exciton blocking layer and organic photoactive layer.

Example 2

Thermal stabilities of the PtQ$_2$ complexes were characterized by thermogravimetric analysis (TGA) before vacuum deposition. The decomposition temperature ($T_d$) was measured with a scanning rate of 15° C./min under a nitrogen atmosphere. The decomposition temperature of Complexes 1 and 5 are 477° C. and 461° C. respectively.

Example 3

Figure 3:
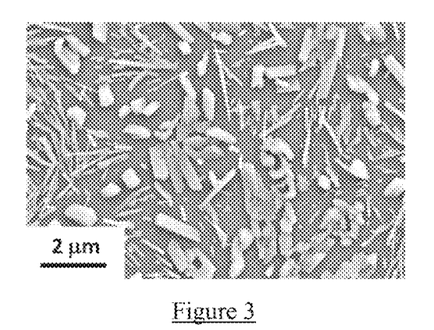
FIG. 3 is a scanning electron micrograph image of complex 1 on a silicon dioxide surface.
Figure 4:
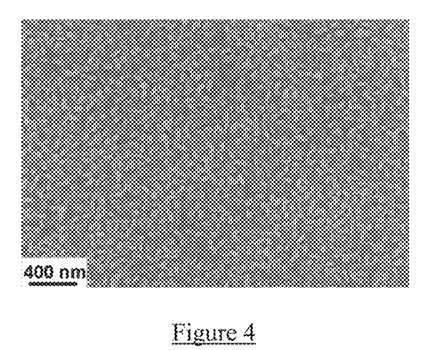
FIG. 4 is a scanning electron micrograph image of complex 2 on a silicon dioxide surface.
Figure 5:
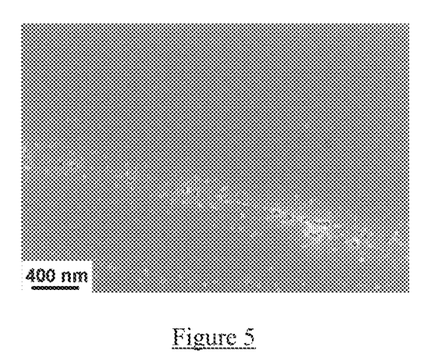
FIG. 5 is a scanning electron micrograph image of complex 3 on a silicon dioxide surface.
Figure 6:
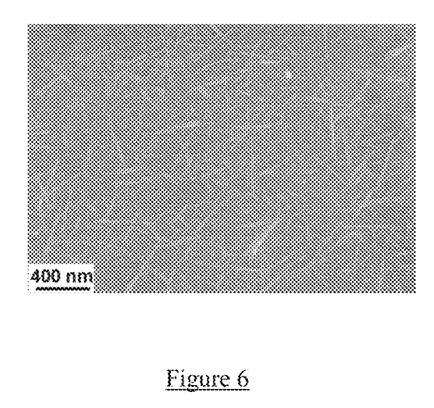
FIG. 6 is a scanning electron micrograph image of complex 4 on a silicon dioxide surface.
Figure 7:
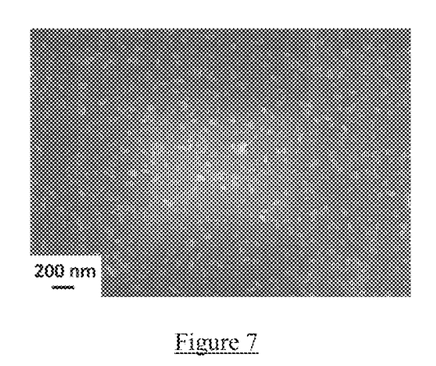
FIG. 7 is a scanning electron micrograph image of complex 5 on a silicon dioxide surface.
Figure 8:
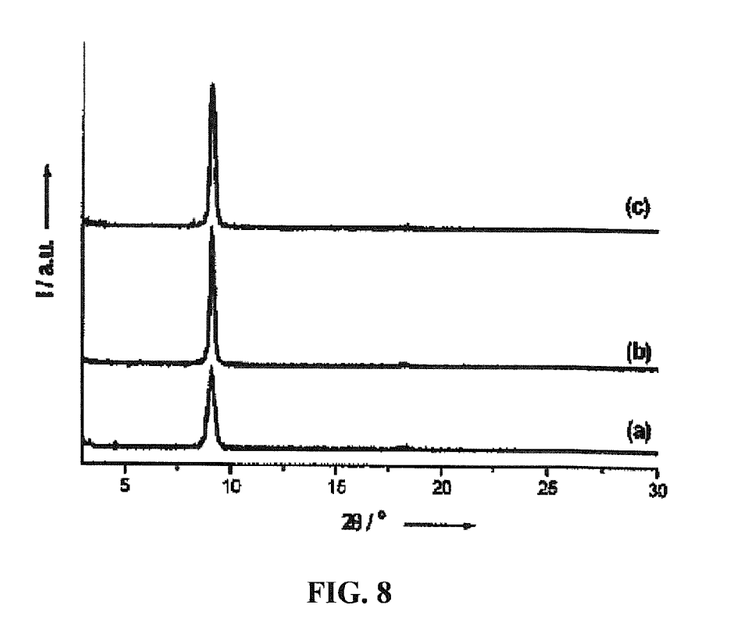
FIG. 8 is a power X-ray diffraction pattern of a thin film 5 (50 nm) after annealing at different temperatures: (a) 25° C.; (b) 80° C.; and (c) 100° C.

The film morphologies (FIGS. 3-7) of PtQ$_2$ complexes 1-5 on a silicon dioxide surface were characterized by scanning electron microscopy (SEM). FIG. 3 shows complex 1, FIG. 4 shows complex 2, FIG. 5 shows complex 3, FIG. 6 shows complex 4, and FIG. 7 shows complex 5. All films were deposited with a deposition rate of 2 Ås$^{-1}$. As shown in FIG. 3, complex 1 exhibits a thin film with micrometer-sized crystal grains and complexes 2-5 exhibit continuous thin film with nano-sized crystal grains (FIGS. 4-7). To confirm the crystalline nature of the thin film, power X-ray diffraction experiments were performed on vacuum deposited thin film 5. Thin film of complex 5 shows a sharp power X-ray diffraction peak at 2θ=9.2°, which indicates the thin film is crystalline and the molecules are arranged with a d spacing of 9.60 Å. The thin film 5 becomes more crystalline upon annealing at 80° C. and 100° C. as indicated by the enhancement in diffraction intensity (FIG. 8).

Example 4

The power conversion efficiency (η), fill factor (FF), open-current voltage ($V_{OC}$), and short-circuit current density ($J_{SC}$) of the organic photovoltaic cell fabricated with PtQ$_2$ complexes were measured respectively and their performances are listed in Table 1. The PtQ$_2$ based photovoltaic devices were fabricated by vacuum deposition. The photovoltaic device generates direct current upon illumination and the power conversion efficiency and fill factor are comparable to other organic photovoltaic devices. A maximum power conversion efficiency of 2.03% is achieved using a bulk heterojunction device configuration with C$_{60}$ and BCP as an electron donor layer and an exciton blocking layer respectively.

Example 5

An example of using organoplatinum (II) (PtQ$_2$) complexes as organic photovoltaic cell described by the current invention were prepared with the following device structure: ITO/PtQ$_2$ complexes(X nm)/C$_{60}$ (Y nm)/BCP (7.5 nm)/Al (100 nm).

Device A was fabricated using complex 1 as an electron donor in the photoactive layer. Complex 1 was deposited onto the prefabricated transparent ITO glass by vacuum deposition at a rate of 2 Ås$^{-1}$. The thickness of thin film 1 is 30 nm. C$_{60}$ (40 nm) and BCP layers (7.5 nm) were deposited subsequently onto the PtQ$_2$ layer without breaking the vacuum. A 100 nm aluminum layer was deposited as metal electrode. Device A gives a power conversion efficiency η=0.17%, fill factor FF=30%, open-current voltage $V_{OC}$=0.25 V, and short-circuit current density $J_{SC}$=2.25 mA cm$^{-2}$.

Example 6

An example of an embodiment of the present invention was fabricated using complex 5 as electron donor in the photoactive layer of an organic photovoltaic cell. Device B was fabricated with the same device configuration and fabrication procedure as Device A described in Example 5. Device B gives a power conversion efficiency η=1.70%, fill factor FF=40%, open-current voltage $V_{OC}$=0.32 V, and short-circuit current density $J_{SC}$=13.3 mA cm$^{-2}$.

Example 7

The effect of the thickness of an electron accepting layer on the performance of an organic photovoltaic cell was studied. Devices B, C, and D were fabricated using complex 5 (30 nm) as an electron donor and C$_{60}$ as an electron-accepting layer in the photoactive layer described by the current invention. The thickness of the C$_{60}$ (electron-accepting layer) of devices B, C, and D are 40, 50, and 60 nm, respectively. Device B gives a power conversion efficiency η=1.70%, fill factor FF=40%, open-current voltage $V_{OC}$=0.32 V, and short-circuit current density $J_{SC}$=13.3 mA cm$^{-2}$, while the power conversion efficiency of devices C and D are slightly lowered to 1.45% and 1.13%, respectively.

Example 8

The effect of post-fabrication annealing on the performance of an organic photovoltaic cell was studied. Device E was fabricated using complex 5 following the procedure described in Example 5 with the device structure of ITO/Complex 5 (30 nm)/C$_{60}$ (50 nm)/BCP (7.5 nm)/Al (100 nm). Device E was then annealed at 80° C. under nitrogen atmosphere for 1 hour. Device E gives a power conversion efficiency η=1.93%, fill factor FF=38%, open-current voltage $V_{OC}$=0.47 V, and short-circuit current density $J_{SC}$=10.7 mA cm$^{-2}$. Power X-ray diffraction study (FIG. 8) of annealed thin film 5 showed an increase in intensity upon annealing at 80° C., suggesting that the thin film becomes more crystalline after an annealing process. Device F fabricated with the same device configuration and procedure resulted in an increase in the power conversion efficiency (2.07%) and fill factor (42.9%) after annealing at 80° C. for 2 hours.

TABLE 1

| Device | Complex | Annealing Condition | C$_{60}$ Thickness | $J_{SC}$ (mA/ cm$^2$) | VOC (V) | FF (%) | □ (%) |
|---|---|---|---|---|---|---|---|
| A | 1 | n/a | 40 | 2.25 | 0.25 | 30 | 0.17 |
| B | 5 | n/a | 40 | 13.3 | 0.32 | 40 | 1.70 |
| C | 5 | n/a | 50 | 8.08 | 0.57 | 31 | 1.45 |
| D | 5 | n/a | 60 | 5.65 | 0.44 | 46 | 1.13 |
| E | 5 | 80° C., 1 hour | 50 | 10.7 | 0.47 | 38 | 1.93 |
| F | 5 | 80° C., 2 hour | 50 | 8.14 | 0.58 | 43 | 2.03 |

We claim:

1. An organic photovoltaic (OPV) cell comprising an organic photoactive layer comprising bis-(8-quinolinolato-N,O)platinum (II) (PtQ$_2$) having structure I:

Structure I wherein $R_1$-$R_6$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

2. The OPV cell according to claim 1, wherein the OPV cell is a single layer cell.

3. The OPV cell according to claim 1, wherein the OPV cell is a multilayer cell.

4. The OPV cell according to claim 1, wherein the OPV cell is a tandem cell.

5. The OPV cell according to claim 1, wherein the OPV cell is a dispersed heterojunction cell.

6. The OPV cell according to claim 1, wherein the OPV cell further comprises:
a substrate;
a transparent electrode; and
a metal electrode.

7. The OPV cell according to claim 6, wherein the transparent electrode is on and in contact with the substrate, and wherein the organic photoactive layer is on and in contact with the transparent electrode, and wherein the metal electrode is on the organic photoactive layer.

8. The OPV cell according to claim 7, further comprising an exciton blocking layer on and in contact with the organic photoactive layer, wherein the metal electrode is on and in contact with the exciton blocking layer.

9. The OPV cell according to claim 8, wherein the exciton blocking layer comprises a bathocuproine derivative, a bathophenanthroline derivative, a tris-8-hydroxy-quinolinato aluminum derivative, or a 2,9-Bis(naphthalen-2-yl)-4,7-diphenyl-1,10-phenanthroline derivative.

10. The OPV cell according to claim 8, wherein a thickness of the exciton blocking layer is from 7.5 nm to 10 nm.

11. The OPV cell according to claim 7, wherein a thickness of the organic photoactive layer is from 20 nm to 120 nm.

12. The OPV cell according to claim 1, wherein a thickness of the organic photoactive layer is from 20 nm to 120 nm.

13. The OPV cell according to claim 1, wherein the organic photoactive layer further comprises an electron acceptor layer.

14. The OPV cell according to claim 13, wherein the electron acceptor layer comprises a perylene derivative, 3,4,9,10-perylenetetracarboxylic bis-benzimidazole (PTCBI), a quinoxaline derivative, poly(phenylquinoxaline) (PPQ), $C_{60}$, or a composite polymer containing $C_{60}$.

15. An organic photovoltaic (OPV) cell comprising one of the following compounds as the active layer therein:

Complex 1

Complex 2

Complex 3

Complex 4

Complex 5

16. The OPV cell according to claim 15, wherein the OPV cell further comprises:
a substrate;
a transparent electrode on and in contact with the substrate; and
a metal electrode on the active layer,
wherein the active layer is on and in contact with the transparent electrode.

17. A method of forming an organic photovoltaic (OPV) cell, comprising:
forming an organic photoactive layer on a substrate, wherein the organic photoactive layer comprises bis-(8-quinolinolato-N,O)platinum (II) ($PtQ_2$) having structure I:

Structure I wherein $R_1$-$R_6$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

18. The method according to claim 17, further comprising:
forming a transparent electrode on and in contact with the substrate before forming the organic photoactive layer, such that the organic photoactive layer is formed on and in contact with the transparent electrode; and
forming a metal electrode on the organic photoactive layer.

19. The method according to claim 18, wherein the organic photoactive layer and the metal electrode are formed sequentially by vacuum deposition without breaking vacuum.

20. The method according to claim 17, wherein forming the organic photoactive layer comprises:
refluxing a mixture of potassium tetrachloroplatinate ($K_2PtCl_4$) and 8-hydroxyqunilonine in glacial acetic acid to give a suspension;
washing the suspension with water and acetone; and
recrystallizing the suspension in $CH_2Cl_2$ or DMF to give the $PtQ_2$ having structure I.

* * * * *

UNITED STATES PATENT AND TRADEMARK OFFICE
CERTIFICATE OF CORRECTION

PATENT NO. : 9,093,654 B2
APPLICATION NO. : 13/022242
DATED : July 28, 2015
INVENTOR(S) : Chi Ming Che and Hai Feng Xiang It is certified that error appears in the above-identified patent and that said Letters Patent is hereby corrected as shown below:

Specification

Column 4,
Lines 7-8, "(3, 4-ethylenedioxythiophene)" should read --(3, 4-ethylenedioxyhiophene)--.
Lines 7-8, "8-hydroxyquinoline" should read --8-hydroxquinoline--.

Column 5,
Lines 34-36, "8-hydroxyquinoline" should read --8-hydroxyqunilonine--.

Line 63 (Structure), "  " should read --  --.

Signed and Sealed this
Twenty-first Day of June, 2016

Michelle K. Lee
*Director of the United States Patent and Trademark Office*